(12) United States Patent
Hsu et al.

(10) Patent No.: US 8,339,890 B2
(45) Date of Patent: Dec. 25, 2012

(54) MEMORY LEAKAGE AND DATA RETENTION CONTROL

(75) Inventors: Kuoyuan (Peter) Hsu, San Jose, CA (US); Yukit Tang, Sunnyvale, CA (US); Jacklyn Chang, San Ramon, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 293 days.

(21) Appl. No.: 12/788,860

(22) Filed: May 27, 2010

(65) Prior Publication Data
US 2011/0292753 A1 Dec. 1, 2011

(51) Int. Cl.
*G11C 5/14* (2006.01)

(52) U.S. Cl. .................... 365/226; 365/189.09; 365/154; 365/104

(58) Field of Classification Search ............. 365/189.09, 365/226, 154, 104
See application file for complete search history.

(56) References Cited

U.S. PATENT DOCUMENTS 7,227,804 B1 * 6/2007 Kothandaraman et al. ... 365/229
8,004,924 B2 * 8/2011 Leomant et al. .............. 365/229

* cited by examiner

*Primary Examiner* — Thong Q Le
(74) *Attorney, Agent, or Firm* — Lowe Hauptman Ham & Berner, LLP

(57) ABSTRACT

A circuit with leakage and data retention control includes at least one memory cell in a first memory array. The at least one memory cell is coupled to a first power supply voltage and a virtual ground. The circuit includes a current source and an NMOS transistor. The drain of the NMOS transistor is coupled to the virtual ground and the gate of the NMOS transistor is coupled to the current source.

20 Claims, 6 Drawing Sheets

MEMORY LEAKAGE AND DATA RETENTION CONTROL

TECHNICAL FIELD

The present disclosure relates generally to an integrated circuit, more particularly to memory leakage and data retention control.

BACKGROUND

For integrated circuit memory circuits, current leakage and data retention are important design considerations. To lower power consumption, it is desirable to reduce the current leakage. Also, data stored in the memory should not be lost despite variations of process, voltage, and temperature (PVT), particularly when using low power supply voltage VDD (Vcc_min).

Accordingly, new circuits and methods are desired to improve on the above issues.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
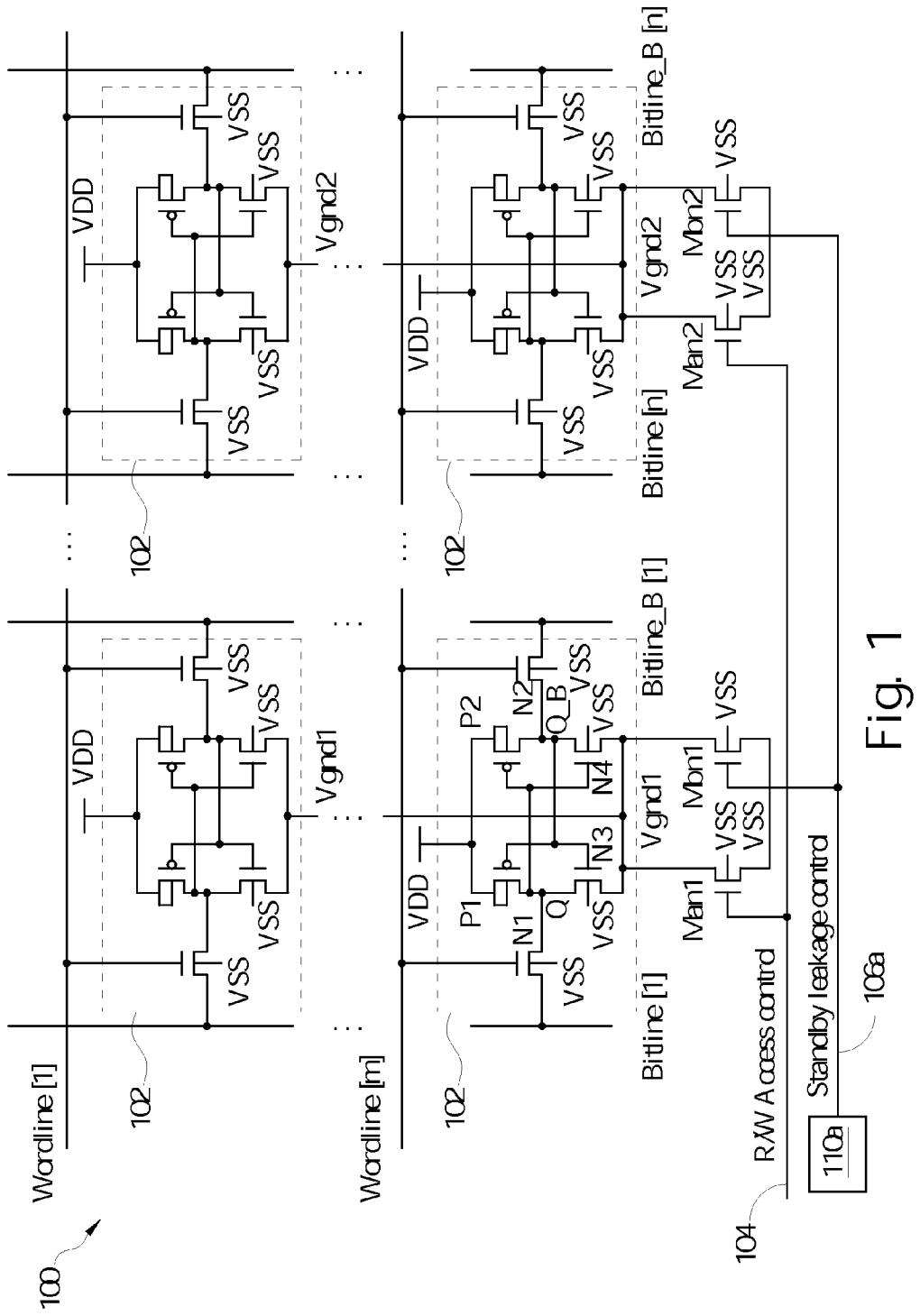
FIG. 1 is a schematic diagram showing an example of a memory array with leakage/data retention control according to some embodiments.

FIG. 1 is a schematic diagram showing an example of a memory array with leakage/data retention control according to some embodiments. Memory cells 102 in a memory array 100 (e.g., an m×n array, where m and n are positive integers) are coupled to wordlines, e.g., Wordline [1]-Wordline [m], bitlines, e.g., Bitline [1]-Bitline [n], and bitline bars, e.g., Bitline_B [1]-Bitline_B [n], that enable access to the memory cells 102 for both read and write operations. The memory cells 102 are also coupled to a high power supply voltage VDD, and a virtual ground (i.e., a virtual voltage that is not necessary fixed to one value), e.g., Vgnd 1 and Vgnd 2 (there can be n different virtual grounds, one for each bitline). Each memory cell 102 is shown as a 6T (transistor) cell in this example. However, the memory cell 102 is not limited to the 6T cell structure.

The read/write (R/W) access control signal 104 is used to enable read and write to the memory cells 102 by coupling them to the low power supply voltage VSS (e.g., ground). The standby leakage control signal 106a is used to provide a constant current flow (i.e., current bias) through NMOS transistors Mbn1 and Mbn2. The standby leakage control signal 106a can have a voltage value not limited to a digital signal. A circuit 110a that controls the current through NMOS transistors Mbn1 and Mbn2, e.g., a current mirror circuit and/or other current sources known in the art, are coupled to the standby leakage control signal 106a to provide the current bias.

For illustration, the memory cell 102 coupled to the Wordline [m], Bitline [1], and Bitline_B[1] is described as an example below. During a standby mode, the wordlines are not asserted and it is assumed that the Bitline [1] and Bitline_B [1] are kept at VDD. If the Vgnd1 is directly connected to VSS, there will be leakage currents through the memory cells 102 from VDD to VSS, e.g., through NMOS transistors N1, N2, N3, and N4, and PMOS transistors P1 and P2. For example, if the voltage at node Q is a logical 0, e.g., VSS, and the voltage at node Q Q_B is a logical 1, e.g., VDD, the PMOS transistor P1 is turned off, the NMOS transistor N3 is turned on. Also, the PMOS transistor P2 is turned on, and the NMOS transistor N4 is turned off. Because the Wordline [m] is not asserted during a standby mode, NMOS transistors N1 and N4 are turned off. Even though the PMOS transistor P1 and NMOS transistors N1 and N2 are turned off, there are leakage currents through these transistors.

Similarly, if the voltage at node Q_B is a logical 0, e.g., VSS, then there are leakage currents through the NMOS transistors N2 and N3, and also the PMOS transistor P2. (For further illustration, it is assumed that node Q has a logical 0 and node Q_B has a logical 1, e.g., VDD.)

By having a constant bias current through Mbn1, the virtual ground Vgnd 1 becomes higher than VSS. The leakage current from VDD to VSS through the memory cell 102 is reduced because of the following. The leakage current through the NMOS transistor N4 is reduced, because the source voltage of the NMOS transistor N4 at the virtual ground Vgnd 1 is higher than VSS, thus reducing Vds (i.e., drain-source voltage) of the NMOS transistor N4. The leakage current through the NMOS transistor N1 is reduced, because the voltage of the NMOS transistor N1 at node Q coupled to Vgnd 1 (through the NMOS transistor N3) is higher than VSS, thus reducing Vgs (i.e., gate-source voltage) of the NMOS transistor N1. The leakage current through the PMOS transistor P1 is reduced, because the Vds of the PMOS transistor P1 is reduced. The NMOS transistor, e.g., Mbn1, can be shared among memory cells 102 in the same column that shares bitlines, e.g., Bitline [1] and Bitline_B [1].

The bias current through Mbn1 is controlled through the current source (not shown) coupled to the standby leakage control signal 106a. In one embodiment, the current bias is maintained so that the voltage difference between VDD and Vgnd 1 ($\Delta V$) is at least 2.2 times the maximum threshold voltage of the PMOS transistors P1 and P2 (which can be referred to as "pull up" transistors) and the NMOS transistors N3 and N4 (which can be referred to as "pull-down" transistors). If the $\Delta V$ is too low, e.g., Vgnd 1 becomes close to the VDD, the memory cell 102 can have difficulty in retaining the stored data in the memory cell 102 under PVT variations.

For example, if Vgnd 1 becomes higher, the voltage at node Q coupled to Vgnd 1 through the NMOS transistor N3 becomes higher, which causes the PMOS transistor P2 to be not fully turned on and reduces the current through the PMOS transistor P2. If there is a voltage noise (e.g., power noise or coupling noise, etc.) that lowers VDD and thus lowers the voltage at node Q_B, the PMOS transistor P1 that was previously turned off can be slightly turned on, which increases the voltage at node Q even more. Higher voltage at node Q coupled to the gate of the PMOS transistor P2 reduces the current through the PMOS transistor P2 even more and increases the current through the NMOS transistor N4 that was previously turned off. This in turn lowers the voltage at node Q_B even more, and the process repeats until the voltage at node Q_B becomes a logical 0 and the voltage at node Q becomes a logical 1, which means that the previous data of the voltage at node Q at logical 0 is lost.

Therefore, it is desired to maintain $\Delta V$ at a certain level (e.g., 2.2 times the maximum threshold voltage of the PMOS transistors P1 and P2, and the NMOS transistors N3 and N4) while the bias current through the NMOS transistor Mbn1 keeps Vgnd 1 that is higher than VSS. In the memory array 100, the bias current through the NMOS transistor Mbn1 is used to control the leakage current and $\Delta V$ of the memory cell 102. The constant current bias limits the maximum leakage current to the reference current level from the current source (now shown) coupled to the standby leakage control signal 106a.

In determining the current bias, a minimum $\Delta V$ for data retention has to be satisfied through PVT variations. If there are many acceptable current bias values that satisfy a minimum $\Delta V$ for data retention, a current bias value can be chosen for (1) less leakage current, and/or (2) larger $\Delta V$. In one embodiment, the memory cell 102 as shown in FIG. 1 has only about 27.9% leakage current compared to a conventional memory cell, while maintaining the minimum $\Delta V$ of about 0.431 V under PVT variations. The bias current was about 5.3 μA from a current minor circuit.

Figure 2:
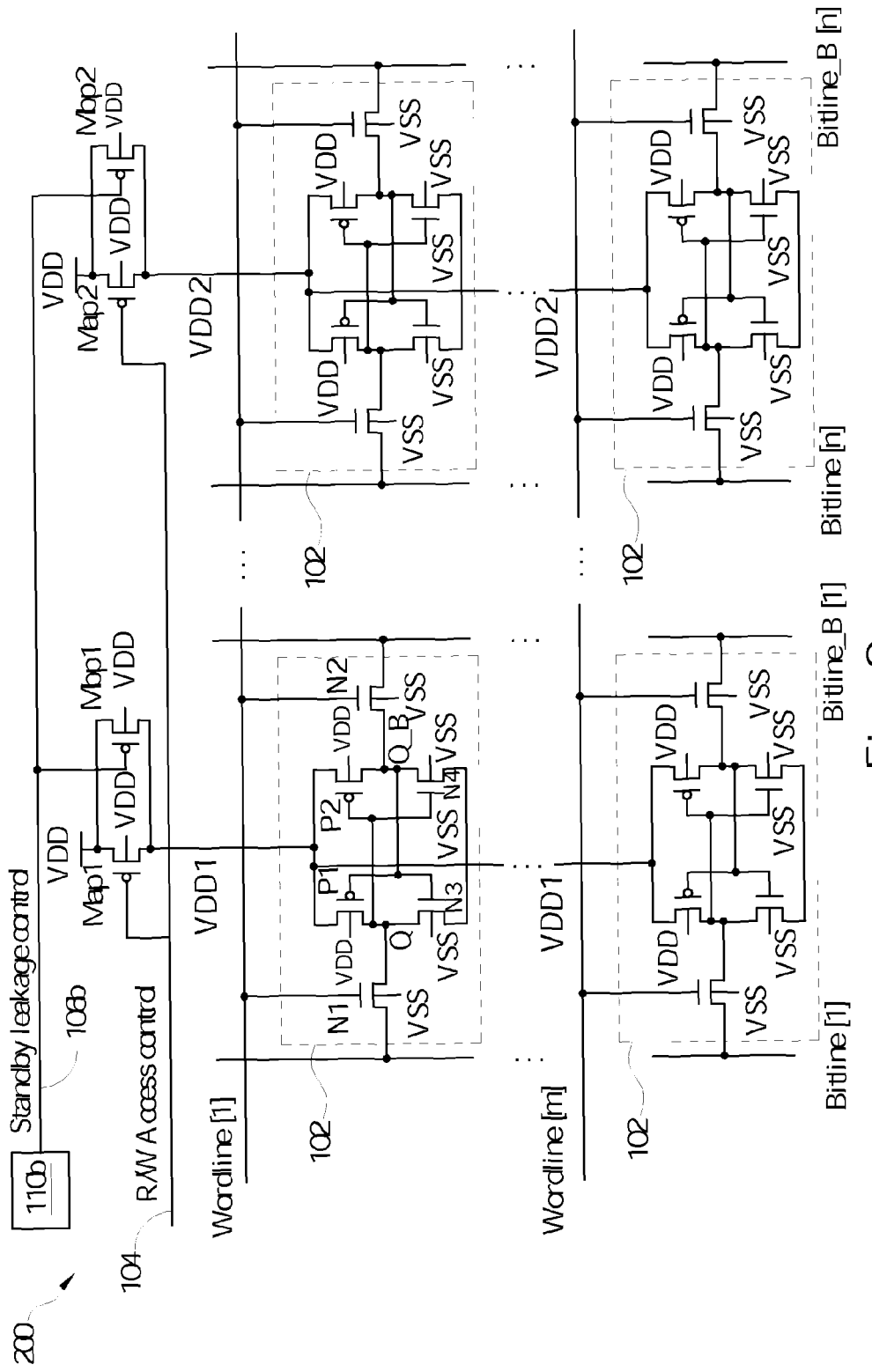
FIG. 2 is a schematic diagram showing another example of a memory array with leakage/data retention control according to some embodiments.

FIG. 2 is a schematic diagram showing another example of a memory array with leakage/data retention control according to some embodiments. The memory array 200 has a similar structure as the memory array 100 in FIG. 1. In this embodiment, however, the memory cells 102 are coupled to a virtual power supply voltage (i.e., a virtual voltage that is not necessarily fixed to one value), e.g., VDD1 and VDD2 (there can be n different virtual power supply voltages, one for each bitline), and to VSS. Also, the R/W access control signal 104 and the standby leakage control signal 106b are on the VDD side.

The R/W access control signal 104 is used to enable read and write to the memory cells 102 by coupling them to VDD. The standby leakage control signal 106b is used to provide a constant current flow (i.e., current bias) through PMOS transistors Mbp1 and Mbp2. A circuit 110b that controls the current through PMOS transistors Mbp1 and Mbp2, e.g., a current mirror circuit and/or other current sources known in the art, are coupled to the standby leakage control signal 106b to provide the current bias.

For illustration, the memory cell 102 coupled to the Wordline [1], Bitline [1], and Bitline_B[1] is described as an example below. During a standby mode, the wordlines are not asserted. If the VDD1 is directly connected to VDD, there will be leakage currents through the memory cells 102 from the VDD to VSS, e.g., through NMOS transistors N1, N2, N3, and N4, and PMOS transistors P1 and P2, as explained above under FIG. 1.

For illustration, it is assumed that Q has a logical 0 and Q_B has a logical 1. Thus the PMOS transistor P1 is turned off. By having a constant bias current through Mbp1, the virtual power supply VDD1 becomes lower than VDD. The leakage current from VDD to VSS through the memory cell 102 is reduced because of the following. The leakage current through the PMOS transistor P1 is reduced because the source voltage of the PMOS transistor P1 coupled to VDD1 is lower than VDD, thus reducing Vds of the PMOS transistor P1. The leakage current through the NMOS transistor N4 is reduced because Vds of the NMOS transistor N4 is also reduced. The PMOS transistor, e.g., Mbp1 can be shared among memory cells 102 in the same column that share bitlines, e.g., Bitline [1] and Bitline_B [1].

The bias current through Mbp1 is controlled through the current source (not shown) coupled to the standby leakage control signal 106b. In one embodiment, the current bias is maintained so that the voltage difference between VDD1 and VSS ($\Delta V$) is at least 2.2 times the maximum threshold voltage of the PMOS transistors P1 and P2, and the NMOS transistors N3 and N4. If the $\Delta V$ is too low, e.g., VDD1 becomes close to the VSS, the memory cell 102 can have difficulty in retaining the stored data in the memory cell 102 under PVT variations, as explained above under FIG. 1.

Therefore, it is desired to maintain $\Delta V$ at a certain level (e.g., 2.2 times the maximum threshold voltage of the PMOS transistors P1 and P2, and the NMOS transistors N3 and N4) while the bias current through the PMOS transistor Mbp1 keeps VDD1 below VDD. In the memory array 200, the bias current through the PMOS transistor Mbp1 is used to control the leakage current and $\Delta V$ of the memory cell 102. The constant current bias will limit the max leakage current to the reference current level from the current source (now shown) coupled to the standby leakage control signal 106b.

In determining the current bias, a minimum $\Delta V$ for data retention has to be satisfied through PVT variations. If there are many acceptable current bias values that satisfy a minimum $\Delta V$ for data retention, a current bias value can be chosen for (1) less leakage current, and/or (2) larger $\Delta V$.

Figure 3:
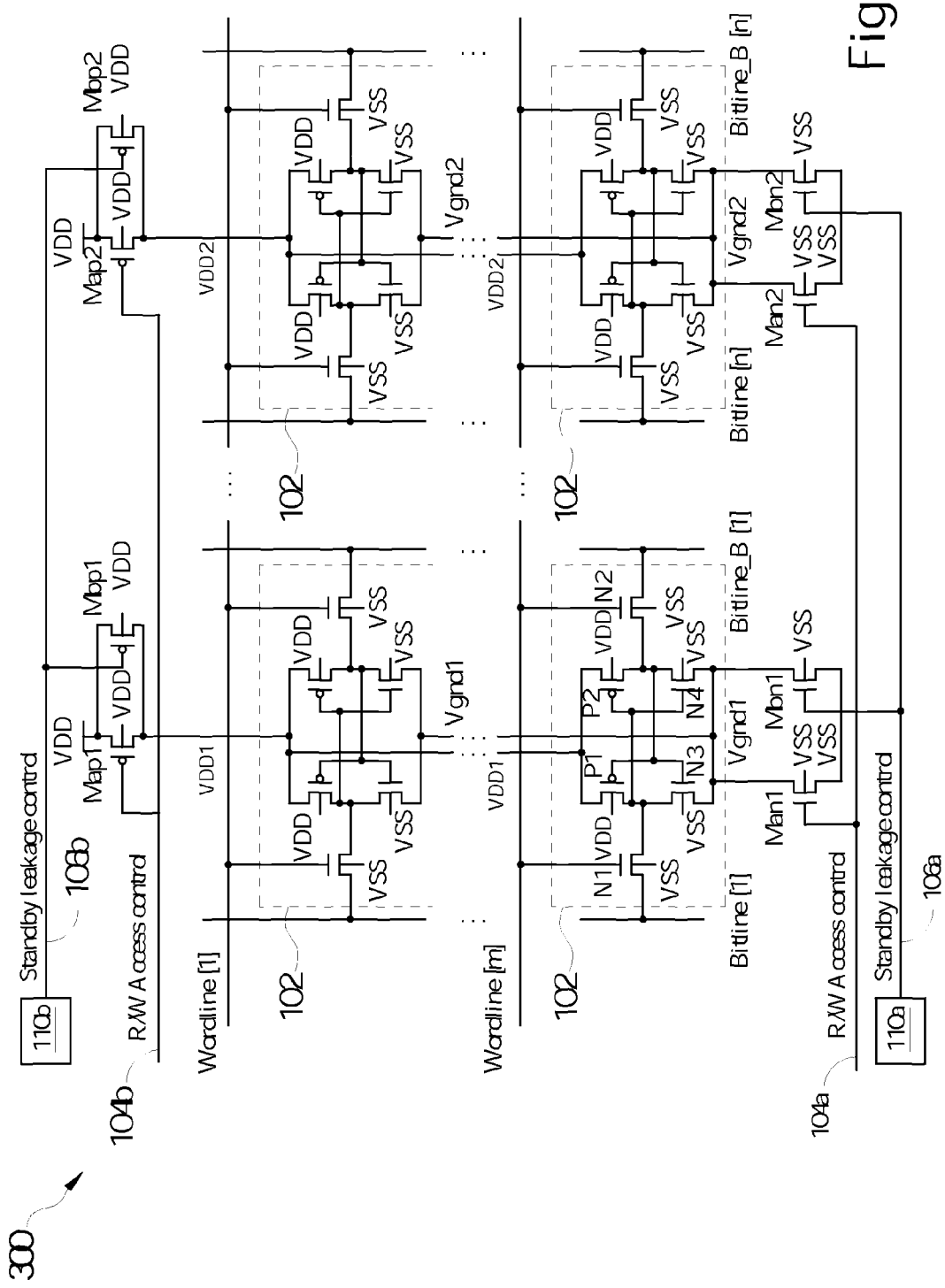
FIG. 3 is a schematic diagram showing yet another example of a memory array with leakage/data retention control according to some embodiments.

FIG. 3 is a schematic diagram showing yet another example of a memory array with leakage/data retention control according to some embodiments. A memory array 300 has a similar structure as the memory array 100 in FIGS. 1 and 200 in FIG. 2. In this embodiment, however, the memory cells 102 are coupled to both the virtual ground, e.g., Vgnd 1 and Vgnd 2, and the virtual power supply, e.g., VDD1 and VDD2.

The read/write (R/W) access control signals 104a and 104b are used to enable read and write to the memory cells 102 by coupling them to VSS and VDD, respectively. The standby leakage control signal 106a is used to provide a constant current flow (i.e., current bias) through NMOS transistors Mbn1 and Mbn2. The standby leakage control signal 106b is used to provide a constant current flow (i.e., current bias) through PMOS transistors Mbp1 and Mbp2. Circuits 110a and 110b that control the current through NMOS transistors Mbn1 and Mbn2, and PMOS transistors Mbp1 and Mbp2, e.g., a current mirror circuit and/or other current sources known in the art, are coupled to the standby leakage control signals 106a and 106b to provide the current bias.

The operation of the circuit 300 is similar to the memory array circuits 100 and 200, as explained above in the descriptions of FIG. 1 and FIG. 2. In one embodiment, the current bias is maintained so that the voltage difference between VDD1 and Vgnd 1 ($\Delta V$) is at least 2.2 times the maximum threshold voltage of the PMOS transistors P1 and P2, and the NMOS transistors N3 and N4. If the $\Delta V$ is too low, the memory cell 102 can have difficulty in retaining the stored data in the memory cell 102 under PVT variations, as explained above under FIG. 1.

Therefore, it is desired to maintain ΔV at a certain level (e.g., 2.2 times the maximum threshold voltage of the PMOS transistors P1 and P2, and the NMOS transistors N3 and N4), while the bias current through the NMOS transistor Mbn1 keeps Vgnd 1 above VSS and the bias current through the PMOS transistor Mbp1 keeps VDD1 below VDD. In the memory array 300, the bias currents through the NMOS transistor Mbn1 and the PMOS transistor Mbp1 is used to control the leakage current and ΔV of the memory cell 102. The constant current bias limits the maximum leakage current to the reference current level from the current source (now shown) coupled to the standby leakage controls 106a and 106b.

In determining the current bias, a minimum ΔV for data retention has to be satisfied through PVT variations. If there are many acceptable current bias values that satisfy a minimum ΔV for data retention, a current bias value can be chosen for (1) less leakage current, and/or (2) larger ΔV.

Figure 4:
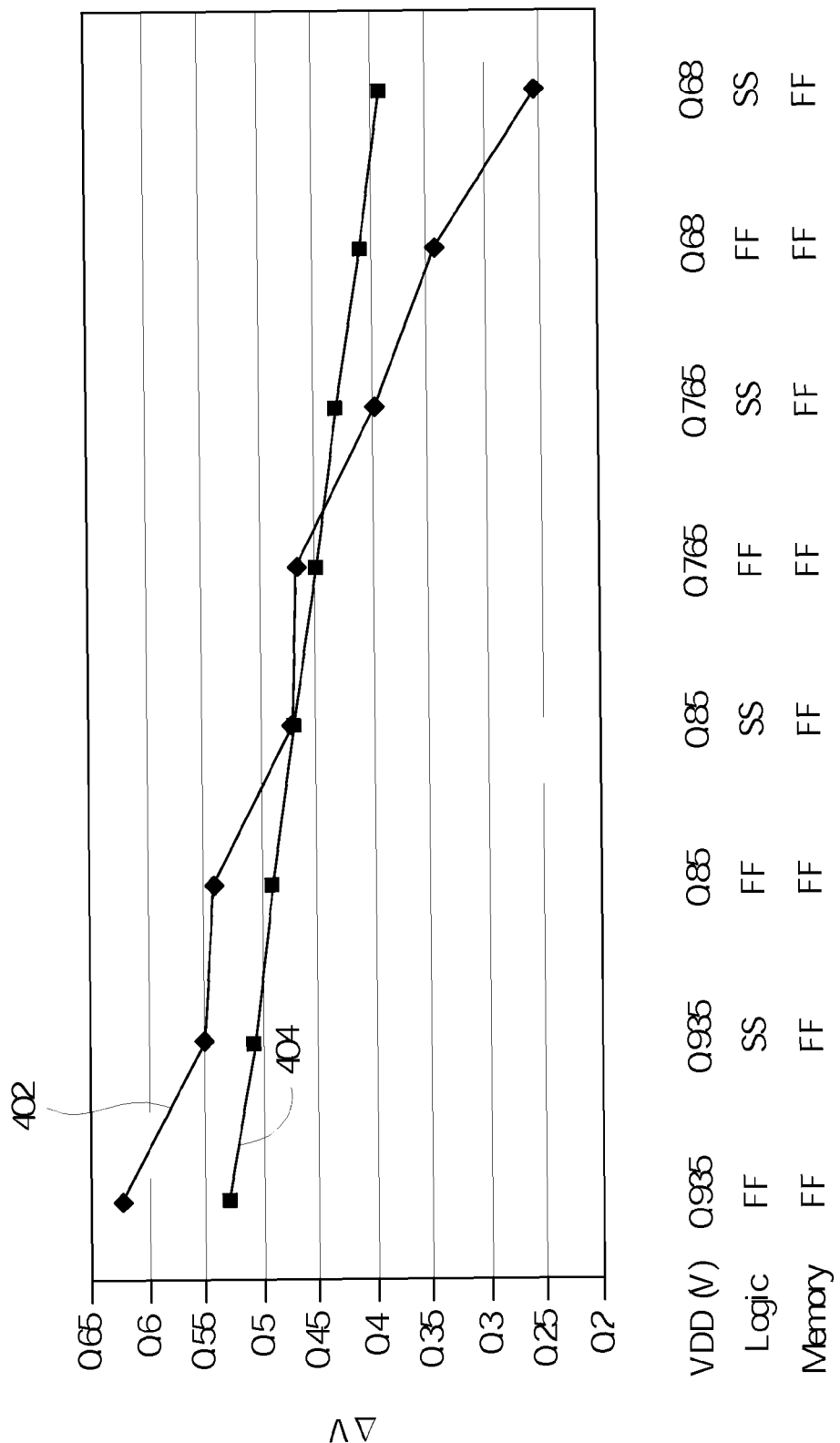
FIG. 4 is a plot showing the voltage difference between VDD and Vgnd 1 ($\Delta V$) comparison between a conventional memory array and an exemplary memory array (with leakage/data retention control) in FIG. 1 according to some embodiments.

FIG. 4 is a plot showing ΔV comparison between a conventional memory array and an exemplary memory array (with leakage/data retention control) in FIG. 1 according to some embodiments. The temperature is at 125° C., "Logic" refers to a logic circuit for the memory array 100, "Memory" is the memory array 100, "FF" refers to relatively fast PMOS and NMOS transistors in the wafer from process corners, "SS" refers to relatively slow PMOS and NMOS transistors in the wafer from process corners. Compared to a conventional circuit's ΔV variation 402, the ΔV variation 404 of an exemplary memory array in FIG. 1 showed less impact from process and voltage variations. In particular, at lower VDD, there is more risk of losing data for the conventional circuit with a low ΔV.

Figure 5:
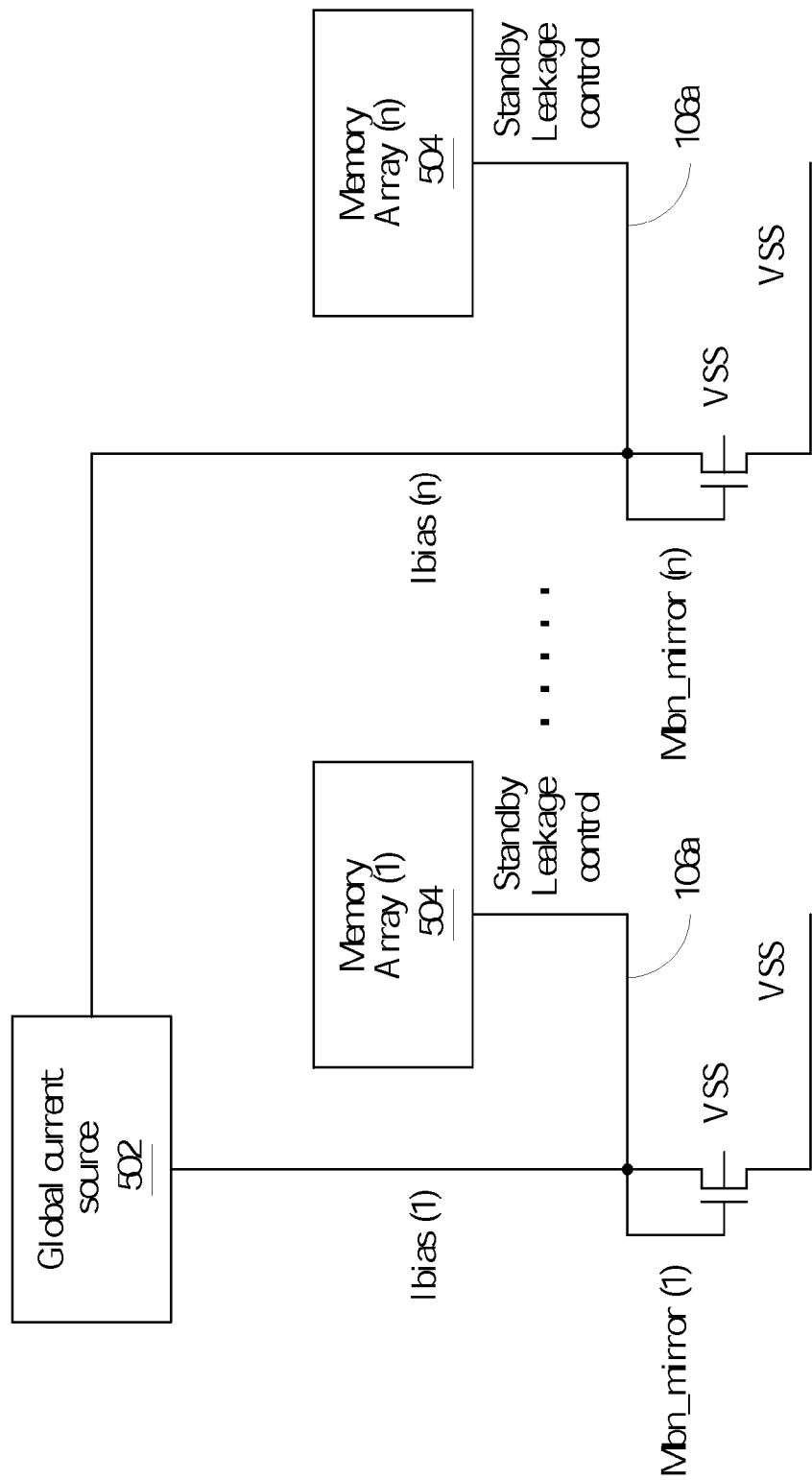
FIG. 5 is a schematic diagram showing an example of multiple memory arrays with leakage/data retention control according to some embodiments.

FIG. 5 is a schematic diagram showing an example of multiple memory arrays with leakage/data retention control according to some embodiments. A global current source 502 and current minor NMOS transistors, e.g., Mbn_mirror (1), . . . , Mbn_mirror (n), correspond to the circuit 110a in FIG. 1 and FIG. 3. The global current source 502 with a global current reference is used for multiple memory arrays 504 to supply bias currents, e.g., Ibias (1), . . . , Ibias (n), to the current mirror NMOS transistors, e.g., Mbn_mirror (1), . . . , Mbn_mirror (n), which are located close to the respective memory array 504 coupled to the standby leakage control signal 106a. The memory array 504 can have the same structure as the memory array 100 in FIG. 1.

By sending a global current reference from a global current source 502 to memory arrays 504 in local areas, global mismatch among bias currents are prevented and a voltage drop issue at different locations when using a global voltage reference from one location is avoided. Also, by having the current mirror NMOS transistors, e.g., Mbn_mirror (1), . . . , Mbn_mirror (n), close to the memory arrays 504, the proximity of the location reduces device mismatch between them from process variations, e.g., doping level, layer thickness, etc. This helps to enhance the precision of current mirror control using the current mirror NMOS transistors, e.g., Mbn_mirror (1), . . . , Mbn_mirror (n).

Figure 6:
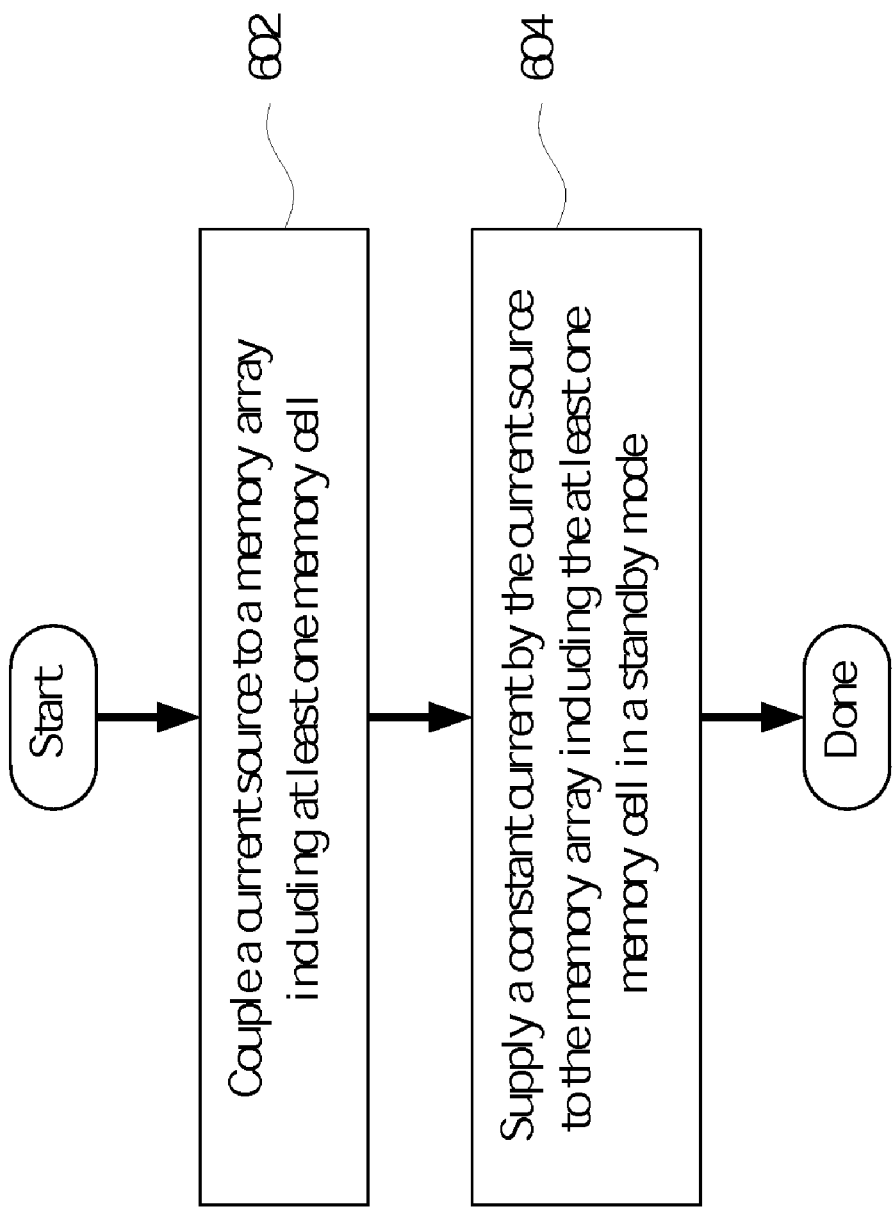
FIG. 6 is a flow diagram showing an exemplary method of a memory array with leakage/data retention control according to some embodiments.

FIG. 6 is a flow diagram showing an exemplary method of a memory array with leakage/data retention control according to some embodiments. At step 602, a current source, e.g., 502, is coupled to a memory array, e.g., 504, including at least one memory cell, e.g., 102. At step 604, a constant current is supplied by the current source, e.g., 502, to the memory array, e.g., 504, including at least one memory cell, e.g., 102, in a standby mode. The current source, e.g., 502, can be shared with another memory array, e.g., 504.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The above method embodiment shows exemplary steps, but they are not necessarily required to be performed in the order shown. Steps may be added, replaced, changed order, and/or eliminated as appropriate, in accordance with the spirit and scope of embodiments of the disclosure.

Each claim of this document constitutes a separate embodiment, and embodiments that combine different claims and/or different embodiments are within scope of the disclosure and will be apparent to those skilled in the art after reviewing this disclosure.

What is claimed is:

1. A circuit, comprising:
   at least one memory cell in a first memory array, wherein the at least one memory cell is coupled to a first voltage source and a virtual voltage source;
   a current source; and
   a transistor, wherein a drain of the transistor is coupled to the virtual voltage source, and a gate of the transistor is coupled to the current source and current flowing through the transistor mirrors current from the current source.

2. The circuit of claim 1, wherein the current source comprises a current minor circuit.

3. The circuit of claim 1, wherein the transistor is an NMOS transistor and a source of the NMOS transistor is coupled to a second voltage source that is adapted to supply a voltage lower than a voltage supplied by the first voltage source.

4. The circuit of claim 3, wherein the second voltage source is coupled to a ground.

5. The circuit of claim 1, wherein the virtual voltage source is shared among the at least one memory cell.

6. The circuit of claim 1, wherein the current source is shared with a second memory array.

7. The circuit of claim 1, wherein the circuit is adapted to maintain a voltage difference between a value of the first voltage source and a value of the virtual voltage source to retain data stored in the at least one memory cell in a standby mode.

8. The circuit of claim 7, wherein the circuit is adapted to maintain the voltage difference between the value of the first voltage source and the value of the virtual voltage source to be at least 2.2 times of a maximum threshold voltage of pull up PMOS transistors and pull down NMOS transistors in the at least one memory cell.

9. The circuit of claim 1, wherein the transistor is a PMOS transistor and a source of the PMOS transistor is coupled to a second voltage source that is adapted to supply a voltate higher than a voltage supplied by the first voltage source.

10. A circuit, comprising:
   at least one memory cell in a first memory array, wherein the at least one memory cell is coupled to a first virtual voltage source and a second virtual voltage source, and the first virtual voltage source is adapted to supply a voltage that is lower than a voltage supplied by the second virtual voltage source;
   a first current source;
   a second current source;
   an NMOS transistor, wherein a drain of the NMOS transistor is coupled to the first virtual voltage source, and a gate of the NMOS transistor is coupled to the first current source and current flowing through the NMOS transistor mirrors current from the first current source; and
   a PMOS transistor, wherein a drain of the PMOS transistor is coupled to the second virtual voltage source, and a gate of the PMOS transistor is coupled to the second current source and current flowing through the PMOS transistor mirrors current from the first current source.

11. The circuit of claim 10, wherein the first current source comprises a current mirror circuit and the second current source comprises a current mirror circuit.

12. The circuit of claim 10, wherein a source of the NMOS transistor is coupled to a first voltage source adapted to supply a voltage that is lower than a voltage supplied by the first virtual voltage source.

13. The circuit of claim 10, wherein a source of the PMOS transistor is coupled to a second voltage source adapted to supply a voltage that is higher than a voltage supplied by the second virtual voltage source.

14. The circuit of claim 10, wherein the first virtual voltage source and the second virtual voltage source are shared among the at least one memory cell.

15. The circuit of claim 10, wherein the first current source and the second current source are shared with a second memory array.

16. The circuit of claim 10, wherein the circuit is adapted to maintain a voltage difference between the first virtual voltage source and the second virtual voltage source to retain data stored in the at least one memory cell in a standby mode.

17. A method, comprising:
   coupling a current source to a first memory array including at least one memory cell; and
   supplying a constant current from the current source, via a transistor coupled at a gate thereof to the current source, to the first memory array including the at least one memory cell in a standby mode, wherein current flowing through the transistor mirrors the constant current from the current source.

18. The method of claim 17, wherein the transistor comprises a NMOS transistor and the method further comprising coupling a drain of the NMOS transistor to a virtual ground that is coupled to the at least one memory cell, wherein a source of the NMOS transistor is coupled to a low voltage source.

19. The method of claim 17, wherein the transistor is a PMOS transistor and the method further comprising coupling a drain of the PMOS transistor to a virtual voltage that is coupled to the at least one memory cell, wherein a source of the PMOS transistor is coupled to a high voltage source.

20. The method of claim 17, further comprising sharing the current source with a second memory array.

* * * * *